United States Patent
Jung et al.

(10) Patent No.: US 7,569,793 B2
(45) Date of Patent: Aug. 4, 2009

(54) SEQUENTIAL LATERAL SOLIDIFICATION DEVICE AND METHOD OF CRYSTALLIZING SILICON USING THE SAME

(75) Inventors: Yun Ho Jung, Seoul (KR); Young Joo Kim, Anyang-shi (KR)

(73) Assignee: LG Display Co., Ltd., Seoul (KR)

( * ) Notice: Subject to any disclaimer, the term of this patent is extended or adjusted under 35 U.S.C. 154(b) by 324 days.

(21) Appl. No.: 11/518,202

(22) Filed: Sep. 11, 2006

(65) Prior Publication Data

US 2007/0063200 A1 Mar. 22, 2007

Related U.S. Application Data

(62) Division of application No. 10/951,821, filed on Sep. 29, 2004, now Pat. No. 7,115,456.

(30) Foreign Application Priority Data

Dec. 24, 2003 (KR) ............... 10-2003-0096577

(51) Int. Cl.
*B23K 26/14* (2006.01)
*H01L 21/20* (2006.01)
(52) U.S. Cl. .................. 219/121.67; 438/486
(58) Field of Classification Search . 219/121.6–121.86; 438/486, 487
See application file for complete search history.

(56) References Cited

U.S. PATENT DOCUMENTS

| 6,322,625 | B2 | 11/2001 | Im |
| 6,368,945 | B1 | 4/2002 | Im |
| 6,764,886 | B2 * | 7/2004 | Yamazaki et al. ........... 438/164 |
| 6,861,614 | B1 * | 3/2005 | Tanabe et al. .......... 219/121.66 |
| 7,033,434 | B2 | 4/2006 | Kim |

FOREIGN PATENT DOCUMENTS

| JP | 2000-4020 A | 1/2000 |
| JP | 2000-35659 A | 2/2000 |
| JP | 2001-023918 A | 1/2001 |
| JP | 2001-142094 A | 5/2001 |
| JP | 2002-237455 A | 8/2002 |
| JP | 2002-373845 A | 12/2002 |

(Continued)

OTHER PUBLICATIONS

Sposili, Robert S., Crowder, M.A. and Im, James S., "Single-Crystal Si Films Via a Low-Substrate-Temperature Excimer-Laser Crystallization Method," Mat. Res. Soc. Symp. Proc., vol. 452, pp. 956-957, 1997.

*Primary Examiner*—Sang Y Paik
(74) *Attorney, Agent, or Firm*—Birch, Stewart, Kolasch & Birch, LLP

(57) ABSTRACT

A sequential lateral solidification (SLS) device and a method of crystallizing silicon using the same is disclosed, wherein alignment keys are formed on a substrate with one mask having a plurality of different patterns, and a crystallization process is progressed in parallel to an imaginary line connecting the alignment keys with information for a distance between the mask and the alignment key. The SLS device includes a laser beam generator for irradiating laser beams; a mask having a plurality of areas; a mask stage for moving the mask loaded thereto, to transmit a laser beam through a selective area of the mask; and a substrate stage for moving a substrate loaded thereto, to change portions of the substrate irradiated with the laser beam passing through the mask.

14 Claims, 13 Drawing Sheets

FOREIGN PATENT DOCUMENTS

| | | |
|---|---|---|
| JP | 2003-22969 A | 1/2003 |
| JP | 2003-57673 A | 2/2003 |
| JP | 2003-92262 A | 3/2003 |
| JP | 2003-151907 A | 5/2003 |
| JP | 2003-264198 A | 9/2003 |
| JP | 2003-318111 A | 11/2003 |

* cited by examiner

SEQUENTIAL LATERAL SOLIDIFICATION DEVICE AND METHOD OF CRYSTALLIZING SILICON USING THE SAME

CROSS-REFERENCE TO RELATED APPLICATIONS

This application is a divisional of U.S. patent application Ser. No. 10/951,821 filed on Sep. 29, 2004, now U.S. Pat No. 7,115,456 for which priority is claimed under 35 U.S.C. § 120 and the present application claims priority of Patent Application No. 10-2003-0096577 filed in Republic of Korea on Dec. 24, 2003 under 35 U.S.C. § 119. The entire contents of each of these applications are herein fully incorporated by reference.

BACKGROUND OF THE INVENTION

1. Field of the Invention

The invention pertains to a method of crystallizing silicon, and more particularly, to a sequential lateral solidification (SLS) device and a method of crystallizing silicon using the same, in which alignment keys are formed on a substrate with one mask having a multiplicity of different patterns, and crystallization progresses in parallel to an imaginary line connecting the alignment keys with information for a distance between the mask and the alignment key.

2. Discussion of the Related Art

As information technologies develop, various displays increase in demand. Recently, many efforts have been made to research and develop various flat display panels such as a liquid crystal display device (LCD), a plasma display panel (PDP), an electroluminescent display (ELD), a vacuum fluorescent display (VFD), and the like. Some types of the flat display panels have already been used in various display devices.

LCDs are most widely used because of their beneficial characteristics and advantages including high quality images, lightweight, thin and compact size, and low power consumption. LCDs are therefore used as a substitute for cathode ray tubes (CRTs) for mobile image display devices. LCDs have also been developed for use in devices receiving and displaying broadcast signals, such as a television, a computer monitor, and the like.

An LCD device generally includes an LCD panel displaying an image and a driving unit for applying driving signals to the LCD panel. The LCD panel includes first and second glass substrates bonded to each other and a liquid crystal layer injected between the first and second substrates.

Multiple gate lines are formed on the first glass substrate (TFT array substrate) to be arranged in one direction at fixed intervals, and multiple data lines are arranged in perpendicular to the gate lines at fixed intervals. Multiple pixel electrodes are formed as a matrix in pixel regions defined by the gate and data lines crossing each other, and thin film transistors are switched by signals of the gate lines to transfer signals of the data lines to the pixel electrodes.

On the second glass substrate (color filter substrate), there is a black matrix layer for shielding light from other portions except the pixel regions, an R/G/B (Red/Green/Blue) color filter layer for realizing colors, and a common electrode for realizing an image.

Spacers maintain the above-described first and second glass substrates at a predetermined interval therebetween, and the substrates are bonded to each other by a sealant having a liquid crystal injection inlet. Liquid crystal is injected between the two glass substrates.

The driving principle of a general LCD device uses the optical anisotropy and polarization characteristics of liquid crystals. Because the structure of liquid crystal is thin and long, the liquid crystal molecules are aligned to have a specific direction. Based upon dipole moment, the liquid crystal molecules can have either positive or negative dielectric anisotropy. Applying an induced electric field to the liquid crystal controls the direction of the alignment. Therefore, when the alignment of the liquid crystal molecules is arbitrarily controlled, the alignment of the liquid crystal molecules is eventually altered. Subsequently, due to the optical anisotropy of liquid crystals, light rays are refracted in the direction of the alignment of the liquid crystal molecules to thereby form images.

Recent technologies use an active matrix liquid crystal display (LCD), which is formed of a thin film transistor and pixel electrodes aligned in a matrix and connected to the thin film transistor. This technology is considered to have excellent high resolution and an ability to represent animated images.

In an LCD device having a polysilicon semiconductor layer for the thin film transistor, it is possible to form the thin film transistor and a driving circuit on the same substrate. Also, there is no requirement to connect the thin film transistor with the driving circuit, whereby the fabrication process is simplified. In addition, a field effect mobility of polysilicon is one to two hundred times higher than the field effect mobility of amorphous silicon, thereby obtaining a great stability to temperature and light.

The method of fabricating the polysilicon can be divided into a low temperature fabrication process and a high temperature fabrication process, depending upon the fabrication temperature.

The high temperature fabrication process requires a temperature condition of approximately 1,000° C., which is equal to or higher than the temperature for modifying substrates. Because glass substrates have poor heat-resistance, expensive and brittle quartz substrates having excellent heat-resistance should be used. When fabricating a polysilicon thin film by using the high temperature fabrication process, inadequate crystallization may occur due to high surface roughness and fine crystal grains, thereby resulting in poor device characteristics, as compared to the polysilicon formed by the low temperature fabrication process. Therefore, technologies for crystallizing amorphous silicon, which can be vapor-deposited at a low temperature, to form polysilicon have been researched and developed.

The method of depositing amorphous silicon at a low temperature and crystallizing the deposited amorphous silicon can be categorized into a laser annealing process and a metal induced crystallization process.

The laser annealing process includes irradiating a pulsed laser beam onto a substrate. More specifically, by using the pulsed laser beam, the solidification and condensation of the substrate can be repeated about every 10 to 100 nanoseconds. The low temperature fabrication process is acknowledged to have the advantage that the damage caused on a lower insulating substrate can be minimized.

The related art crystallization method of silicon using the laser annealing method will now be explained in detail.

FIG. 1 illustrates a graph showing the size of amorphous silicon particles versus laser energy density.

As shown in FIG. 1, the crystallization of the amorphous silicon can be divided into a first region, a second region, and a third region depending upon the intensity of the incident laser energy.

The first region of FIG. 1 is a partial melting region, where the intensity of the laser energy irradiated onto the amorphous silicon layer melts only the surface of the amorphous silicon layer. After irradiation, the surface of the amorphous silicon layer is partially melted in the first region, whereby small crystal grains form on the surface of the amorphous silicon layer after a solidification process.

The second region of FIG. 1 is a near-to-complete melting region, where the intensity of the laser energy, being higher than that of the first region, almost completely melts the amorphous silicon. After the almost complete melting, the remaining nuclei are used as seeds for a crystal growth, thereby forming crystal particles with an increased crystal growth as compared to the first region. However, the crystal particles formed in the second region are not uniform. The second region is also narrower than the first region.

The third region of FIG. 1 is a complete melting region, whereby laser energy with an increased intensity, as compared to that of the second region, is irradiated to completely melt the amorphous silicon layer. After the complete melting of the amorphous silicon layer, a solidification process is carried out, so as to allow a homogenous nucleation, thereby forming a crystal silicon layer formed of fine and uniform crystal particles.

In this method of fabricating polysilicon, the number of laser beam irradiations and a degree of overlap are controlled so as to form uniform large and rough crystal particles by using the energy density of the second region.

However, the interfaces between the multiple polysilicon crystal particles act as obstacles to the flow of electric current, thereby decreasing the reliability of the thin film transistor device. In addition, collision between electrons may occur within the multiple crystal particles can cause damage to an insulating layer due to the collision current and deterioration, thereby resulting in product degradation or defects. In order to resolve such problems, in the method for fabricating polysilicon by using a sequential lateral solidification (SLS) method, the crystal growth of the silicon crystal particle occurs at an interface between liquid silicon and solid silicon in a direction perpendicular to the interface. The SLS crystallizing method is disclosed in detail by Robert S. Sposilli, M. A. Crowder, and James S. Im, Mat. Res. Soc. Symp. Proc. Vol. 452, pp. 956-957, 1997.

In the related art SLS method, the amount of laser energy, the irradiation range of the laser beam, and the translation distance are controlled, so as to allow a lateral growth of the silicon crystal particle with a predetermined length, thereby crystallizing the amorphous silicon to a single crystal of 1 μm or more.

The irradiation device used in the related art SLS method concentrates the laser beam into a small and narrow region, and the amorphous silicon layer deposited on the substrate therefore cannot be completely changed into polycrystalline with a single irradiation. Therefore, in order to change the irradiation position on the substrate, the substrate having the amorphous silicon layer deposited thereon is mounted on a stage. Then, after irradiating a predetermined area, the substrate is moved so as to allow an irradiation to be performed on another area, thereby carrying out the irradiation process over the entire surface of the substrate.

FIG. 2 illustrates a schematic view of a related art sequential lateral solidification (SLS) device. Referring to FIG. 2, the related art sequential lateral solidification (SLS) device includes a laser beam generator 1, a focusing lens 2 focusing the laser beams discharged from the laser beam generator 1, a mask 3 to dividedly irradiate the laser beam on a substrate 10, and a reduction lens 4 formed below the mask 3 to reduce the laser beam passing through the mask 3 to a constant rate.

Generally, the laser beam generator 1 produces light with a wavelength of about 308 nanometers (nm) using XeCl or a wavelength of 248 nanometers (nm) using KrF in an excimer laser. The laser beam generator 1 discharges an unmodified laser beam. The discharged laser beam passes through an attenuator (not shown), in which the energy level is controlled. The laser beam then passes through the focusing lens 2.

The substrate 10 has an amorphous silicon layer deposited thereon, and the substrate 10 is fixed on an X-Y stage 5 that faces into the mask 3.

In order to crystallize the entire surface of the substrate 10, the X-Y stage 5 is minutely displaced, thereby gradually expanding the crystallized region.

FIG. 3 shows that the mask 3 includes an open part 'A' allowing the laser beam to pass through, and a closed part 'B' blocking the laser beam to prevent irradiation of the substrate. The width of the open part 'A' determines the lateral growth length of the grains formed after the first exposure.

FIG. 3 shows a plane view of a mask used in a laser irradiation process. FIG. 4 shows a crystallized region formed by a laser beam irradiation by using a mask of FIG. 3. Referring to FIG. 3, the mask used in the laser irradiation process is formed to have the open part 'A' having patterns opened at a first interval (a), and the closed part 'B' having patterns closed at a second interval (b). The open and closed parts alternate sequentially.

The laser irradiation process using the mask will be described as follows.

First, the mask 3 is placed over the substrate having an amorphous silicon layer deposited thereon, and then the first laser beam is irradiated onto the substrate. At this time, the irradiated laser beam passes through the multiple open parts 'A' of the mask 3, whereby predetermined portions 22 of the amorphous silicon layer corresponding to the open parts 'A' melts and liquefies, as shown in FIG. 4. In this case, the intensity of laser energy used herein has a value selected from the complete melting region, so that the silicon layer irradiated with the laser completely melts.

At this time, by one laser beam irradiation, the multiple open parts 'A' of the mask 3 correspond to one unit area 20 of the substrate, to which the laser beam irradiated, wherein the unit area 20 has a length 'L' and a width 'S'.

After the laser beam irradiation, silicon grains 24a and 24b grow laterally from interfaces 21a and 21b between the amorphous silicon region and the completely melted and liquefied silicon region and towards the irradiation region. The lateral growth of the silicon grains 24a and 24b proceeds in a perpendicular direction to the interfaces 21a and 21b.

In the predetermined portion 22 irradiated with laser for being corresponding to the open part 'A' of the mask, when the width of the predetermined portion 22 is narrower than the two times of the growth length of the silicon grain 24a, the grains growing inward in a perpendicular direction from both sides of the interface of the silicon region come into contact with one another at a grain boundary 25, thereby causing the crystal growth to stop.

Subsequently, in order to further grow the silicon grain, the stage bearing the substrate is moved to perform another irradiation process on an area adjacent to the first irradiated area. Thus, another crystal forms with the new crystal being connected to the crystal formed after the first exposure. Similarly, crystals laterally form on each side of the completely solidified regions. Generally, the crystal growth length produced by the laser irradiation process and connected to the adjacent irradiation part is determined by the width of open part 'A' and closed part 'B' of the mask.

FIG. 5 shows a grain boundary overlapped in each channel of devices formed along one line on a related art crystallization process.

In the related art crystallization process, the crystallization is performed on the entire surface of the substrate. Accordingly, when crystallizing the substrate, the stage bearing the substrate moves along one direction without any alignment key, to change the laser irradiation area onto the substrate.

However, as shown in FIG. 5, since the crystallization process proceeds without an index such as the alignment key, the grain boundary 25, which is the interface of the grains inside the laser irradiated region, is not rightly perpendicular to the length direction of the device (TFT, 30). Also, the number of grain boundaries overlapped in each channel of the respective devices is different. For example, one device may have one grain boundary 25, but another device may have two grain boundaries 25. That is, even though the respective devices are provided along one line, the number of grain boundaries 25 overlapped in each channel (between source electrode S and drain electrode D) of the respective devices may differ, and the respective devices will therefore have different mobility characteristics (as the number of grain boundaries 25 overlapped in the channel of the device becomes small, the mobility becomes rapid). Thus, the respective devices have the different characteristics even though the respective devices are provided along the same line.

FIG. 6 shows a plane view of respective areas formed on a substrate. Referring to FIG. 6, a thin film transistor array is formed on a substrate 50 of an LCD device. The substrate 50 is defined into a display area 70 of displaying an image, and a non-display area 60 around the display area 70.

At this time, an amorphous silicon layer is formed on an entire surface of the substrate 50. On the display area 70 of the substrate 50, multiple gate and data lines (not shown, formed on other portions except pixel regions of the display area) are formed perpendicular to each other, to define the pixel regions 71. Pixel electrodes are formed in the respective pixel regions 71. Also, a thin film transistor is formed at a predetermined portion of the pixel region 71, and the thin film transistor includes a gate electrode (not shown) protruding from the gate line, a source electrode (not shown) protruding from the data line, and a drain electrode (not shown) formed at a predetermined interval from the source electrode. At this time, a semiconductor layer 75 is formed below the source and drain electrodes, where the semiconductor layer 75 has a channel between the two electrodes. On the non-display area 60, respective driving circuit parts of gate and source drivers 61 and 62 are formed to provide signals to the gate and data lines.

However, the crystallization of the amorphous silicon layer formed on the substrate 50 requires different speeds in the respective areas. Especially, the driving circuit parts 61 and 62, and the thin film transistor (device, 75) of the display area 70 require a mobility speed that is one hundred times higher than those of the remaining portions. Accordingly, in order to decrease the process time and cost for the crystallization, one can omit the crystallization for the remaining portions which don't require the high mobility speed, and to perform the crystallization for the driving circuit parts 61 and 62 and the device 75 of the display area 70.

To crystallize the device 75 on the substrate of the display area 70, it is necessary to provide an index for laser irradiation areas of the substrate. For this, alignment keys are firstly formed on the substrate by a photolithographic process prior to crystallization. In this case, it is necessary to prepare additional masks for the alignment keys, thereby causing the increase of fabrication time and cost for preparation of the masks.

However, the related art SLS device and the method of crystallizing the silicon by using the same have the following disadvantages.

In the related art crystallization process, the crystallization is performed on the entire surface of the substrate without the additional alignment keys. Accordingly, when the substrate is loaded on the stage, the substrate may slide or turn aside. Alternately, when the mask is loaded to the mask stage, the crystallization process of the substrate progresses in a non-parallel fashion because the mask is not loaded at the correct position. However, there is no way to solve these problems in the related art.

The difficulties presented by the related art are especially acute when the gate line, the data line, and the thin film transistor (device) are formed by patterning after crystallization. In this case, the grain boundary formed by the related art crystallization process is not parallel or vertical to the line and device formed in the after-processing, but is instead slanted thereto. Accordingly, even though the respective devices are provided along one line, the respective devices have a different number of grain boundaries overlapped in the channel, which must be corrected since it may cause degradation of the display quality and reduced speed.

Meanwhile, since the crystallization of the amorphous silicon layer formed on the substrate requires the different speeds in the different respective areas, a selective crystallization process has been proposed to decrease the process time and cost for the crystallization. Here, to selectively crystallize the predetermined portion of the substrate, it is necessary to provide alignment keys to index the laser irradiation area on the substrate. In this case, the process requires both a mask for forming the alignment key and an additional mask for crystallization. Also, the process time is delayed due to the replacement time of the masks for alignment key formation process and crystallization process, and the cost of the process increases due to the masks.

SUMMARY OF THE INVENTION

Accordingly, the present invention is directed to a sequential lateral solidification (SLS) device and a method of crystallizing silicon using the same that substantially obviates one or more problems due to limitations and disadvantages of the related art.

An object of the present invention is to provide a sequential lateral solidification (SLS) device and a method of crystallizing silicon using the same, in which alignment keys are formed on a substrate with one mask having multiple different patterns, and a crystallization process is progressed in parallel to an imaginary line connecting the alignment keys with information for a distance between the mask and the alignment key.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a sequential lateral solidification (SLS) device includes a laser beam generator for irradiating laser beams; a mask having multiple areas such as an alignment key area and a crystallization area; a mask stage for moving the mask loaded thereto, to transmit laser beam through a selective area of the mask; and a substrate stage for moving a substrate loaded thereto, to change portions of the substrate irradiated with laser beam passing through the mask.

In the invention, the areas of the mask include at least an alignment key area and a crystallization area. The alignment key area includes multiple minute transmission patterns. The minute transmission patterns are formed at fixed intervals. The substrate is defined as display part including multiple pixels and non-display part including a driving circuit. Crystallization area of the mask is divided into a first area and a second area, the first area corresponding to the display part of the substrate, and the second area corresponding to the non-display part of the substrate. The first area includes at least one pattern block having multiple transmission parts and non-transmission (blocked) parts. The pattern block has a size corresponding to a semiconductor layer of one pixel in the substrate. Multiple pattern blocks are formed at fixed intervals. The second area has multiple transmission part and blocked parts. The mask stage is moved to the right and left directions on the same plane, to be corresponding with the selective area of the mask.

Furthermore, the SLS device includes a tilting mechanism and a leveling mechanism to adjust a minute movement of the mask. The tilting mechanism moves the mask stage horizontally by rotation. The leveling mechanism moves the mask stage vertically.

The invention, in part, pertains to an SLS method includes the steps of preparing a substrate defined as a display part and a non-display part; forming an amorphous silicon layer on an entire surface of the substrate; positioning a mask, defined as an alignment key area and a crystallization area, above the substrate; forming alignment keys by moving the mask to the alignment key area and irradiating laser beam to predetermined portions of the non-display part; and crystallizing the amorphous silicon layer by moving the mask to the crystallization area and irradiating laser beam to the display part and a driving circuit part of the non-display part.

In the invention, the alignment keys are formed at four corners of the non-display part. The alignment keys are formed by irradiating the laser beam passing through the alignment key area of the mask at an energy density suitable for ablation of the amorphous silicon layer of a corresponding portion. The laser beam irradiation using the crystallization area is performed at an energy density to completely melt the amorphous silicon layer of a corresponding portion. The laser beam irradiation using the crystallization area of the mask is performed to obtain the same number of grain boundaries overlapped in each channel of devices provided along one line. A crystallization process direction is parallel with the adjacent alignment keys provided along one line, to obtain the same number of grain boundaries overlapped in each channel of the devices provided along one line. The remaining areas that are not selected by the mask are not irradiated, i.e., blocked from irradiation of the laser beam.

Furthermore, the SLS method can include the step of forming a buffer layer before forming the amorphous silicon layer on the substrate.

The invention, in part, pertains to an SLS method includes the steps of preparing a substrate defined as a display part and a non-display part; forming an amorphous silicon layer over an entire surface of the substrate; positioning a mask above the substrate, the mask having as an alignment key area, a first crystallization area, and a second crystallization area; forming alignment keys by moving the mask to the alignment key area and irradiating laser beam to predetermined portions of the non-display part; crystallizing a portion for a semiconductor layer of the display part by moving the mask to the first crystallization area and irradiating laser beam thereto; and crystallizing a driving circuit of the non-display part by moving the mask to the second crystallization area and irradiating laser beam thereto.

In the invention, the alignment keys are formed at each corners of the non-display part. The alignment key is formed by irradiating the laser beam passing through the alignment key area at an energy density suitable for ablation of the amorphous silicon layer of a corresponding portion. The laser beam irradiation using the first and second crystallization areas is performed at an energy density to completely melt the amorphous silicon layer of a corresponding portion. The remaining areas that are not selected by the mask are not irradiated, i.e., blocked from irradiation of the laser beam. The laser beam irradiation using the first crystallization area is performed to obtain the same number of grain boundaries overlapping in each channel of devices provided along one line. A crystallization process direction is parallel with an imaginary line of connecting the adjacent alignment keys, to obtain the same number of grain boundaries overlapping in each channel of the devices provided along one line. The laser beam irradiation using the second crystallization area is performed by progressing a crystallization process direction in parallel with an imaginary line connecting the adjacent alignment keys. The laser beam irradiation using the second crystallization area is performed in state of dividing a gate driver formation part and a source driver formation part. The crystallization process is performed with the same second crystallization area of the mask by rotating the mask or the substrate at 90° when the crystallization area is shifted from the gate driver formation part to the source driver formation part.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the invention, examples of which are illustrated in the accompanying drawings. Wherever possible, the same reference numbers will be used throughout the drawings to refer to the same or like parts.

Figure 1:
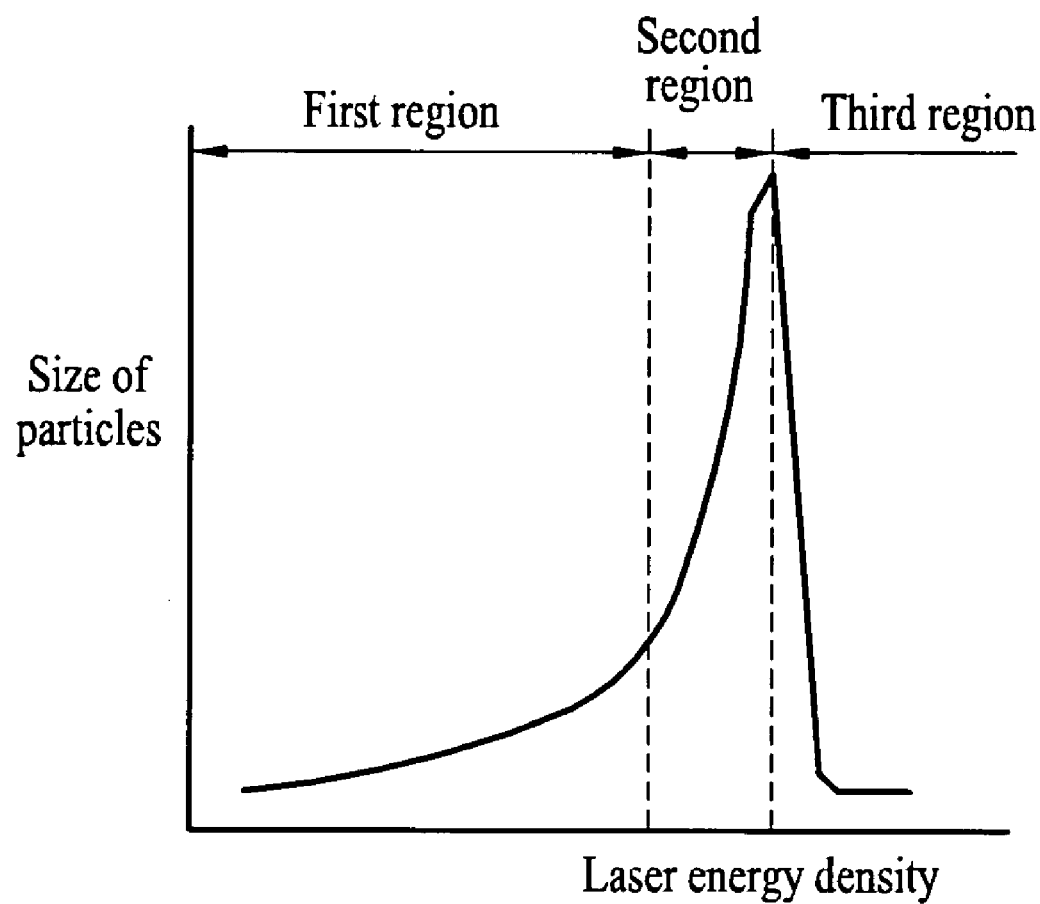
FIG. 1 shows a graph of the size of amorphous silicon particles versus laser energy density.
Figure 2:
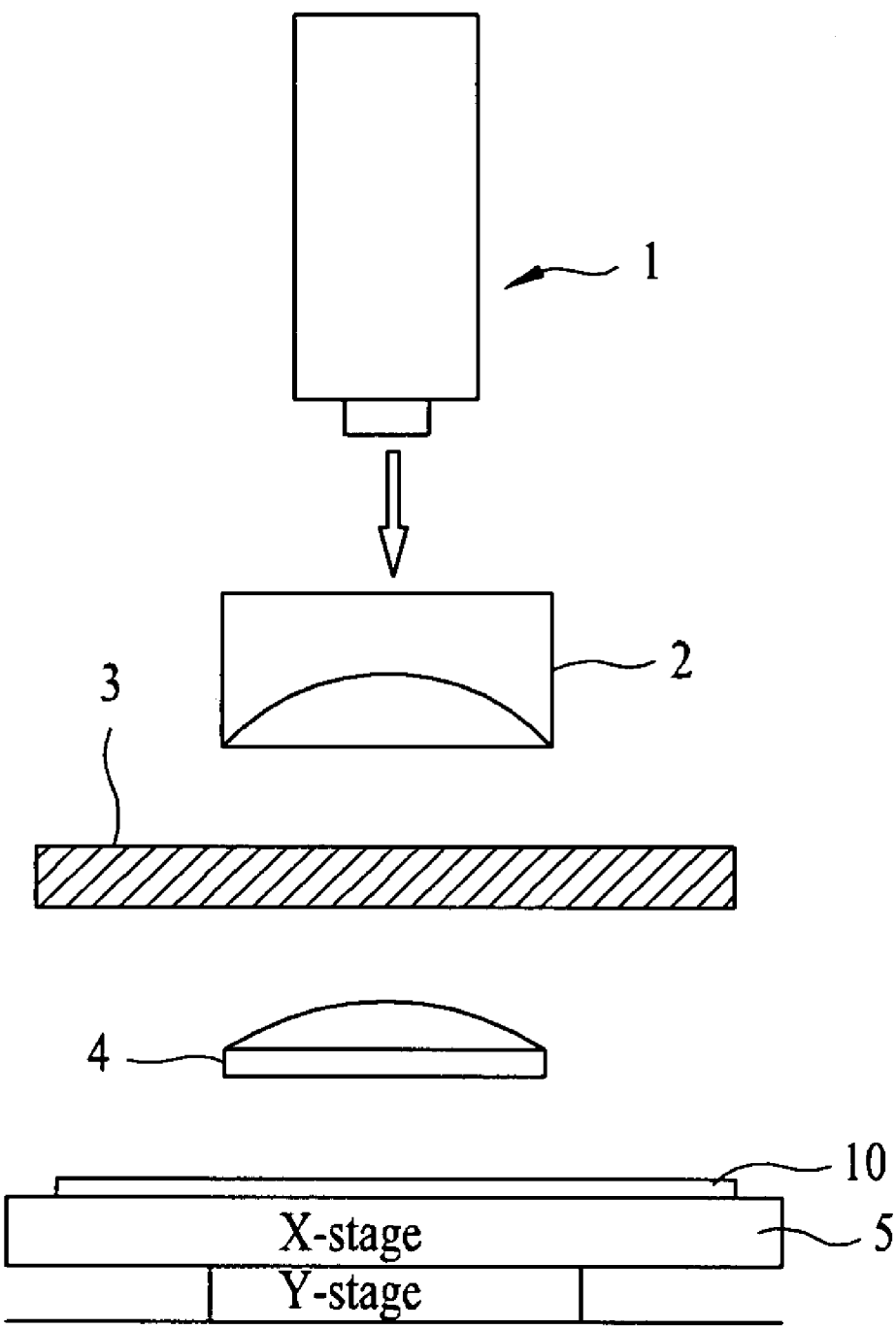
FIG. 2 shows a schematic view of a related art laser irradiation device for a general SLS method.
Figure 3:
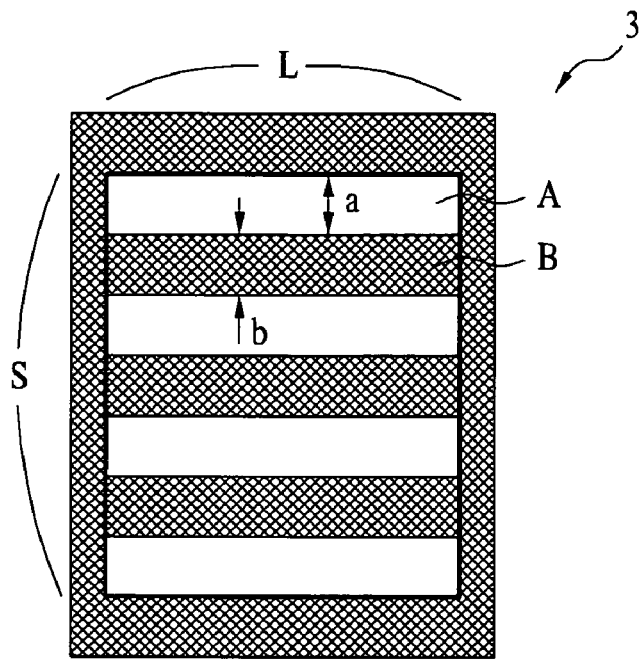
FIG. 3 shows a plane view of a mask used in a laser irradiation process.
Figure 4:
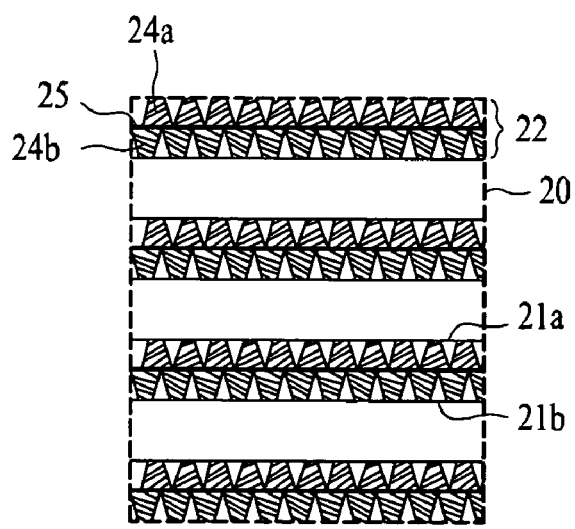
FIG. 4 illustrates a crystallized area formed by a first laser beam irradiation with the mask of FIG. 3.
Figure 5:
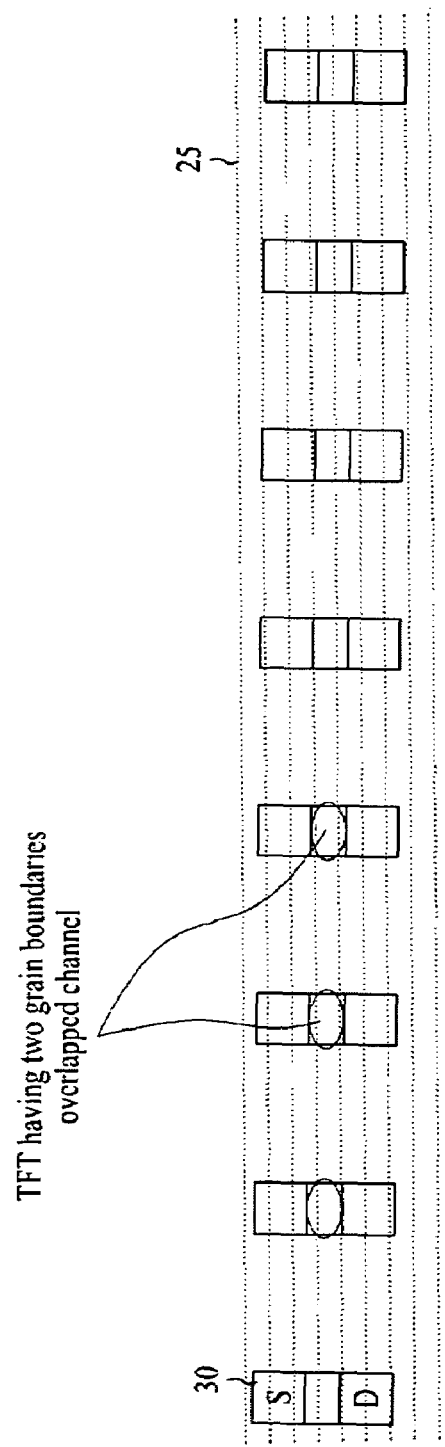
FIG. 5 illustrates a grain boundary overlapped in each channel of devices formed along one line on a crystallization process according to the related art.
Figure 6:
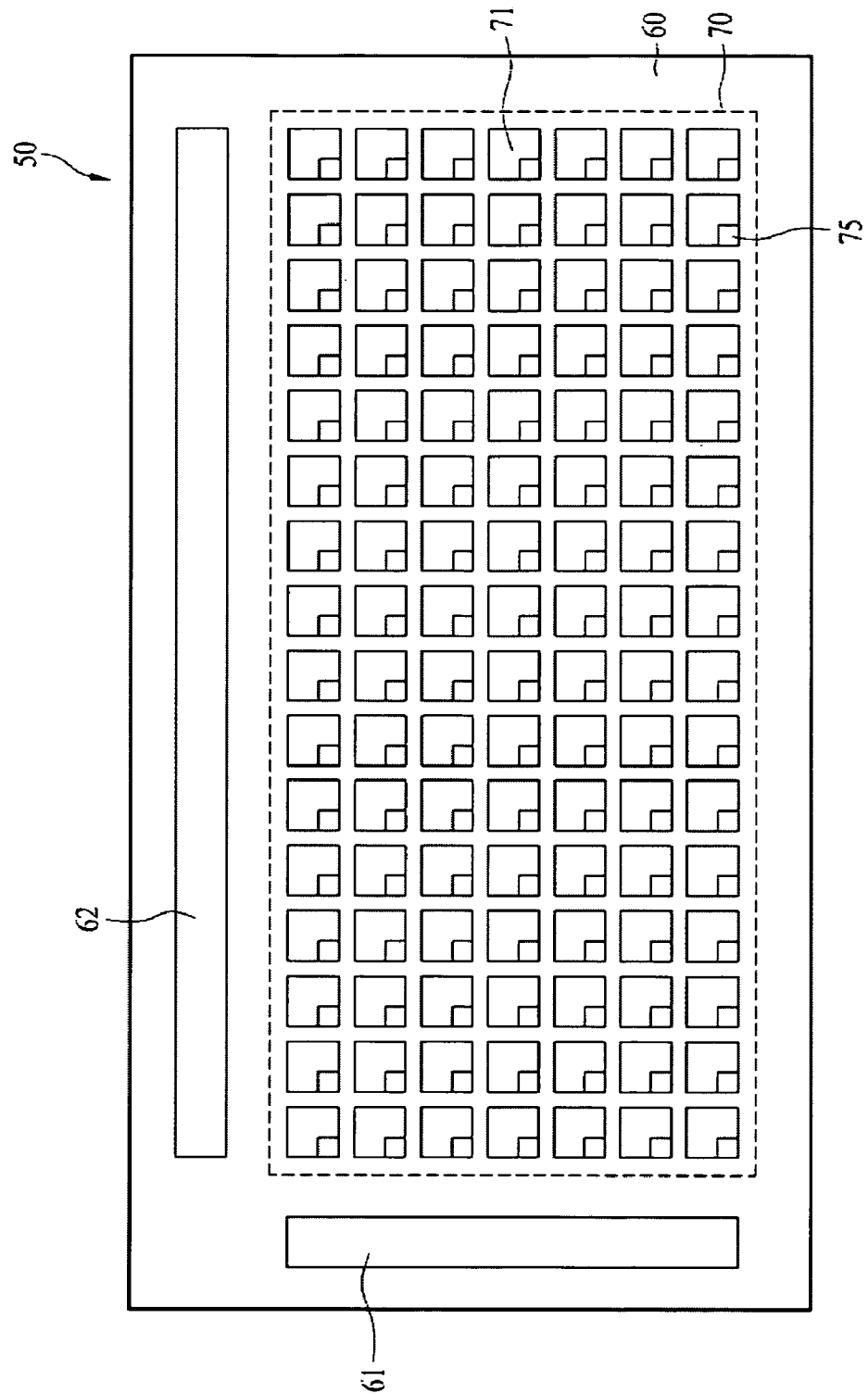
FIG. 6 shows a plane view of respective areas formed on a substrate.
Figure 7:
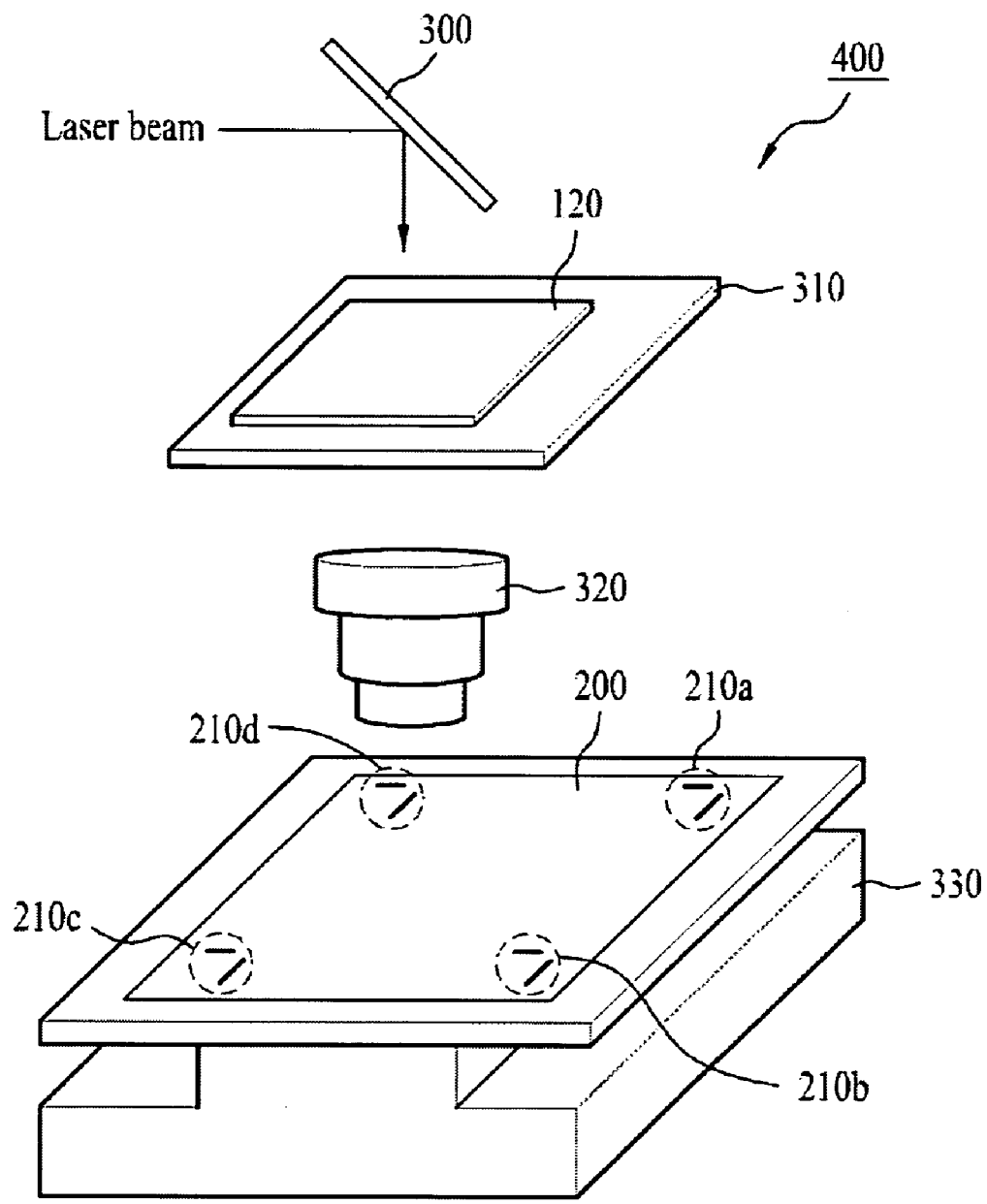
FIG. 7 shows a schematic perspective view of an SLS device according to the invention.
Figure 8:
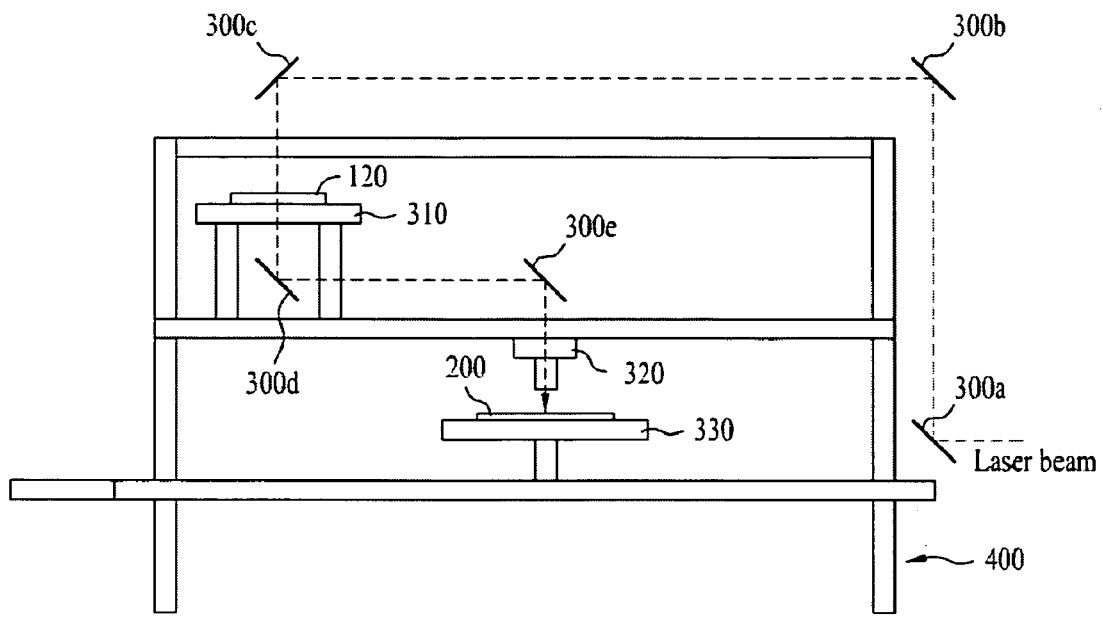
FIG. 8 shows a cross sectional view of a mask stage and a substrate stage in an SLS device according to the invention.
Figure 9:
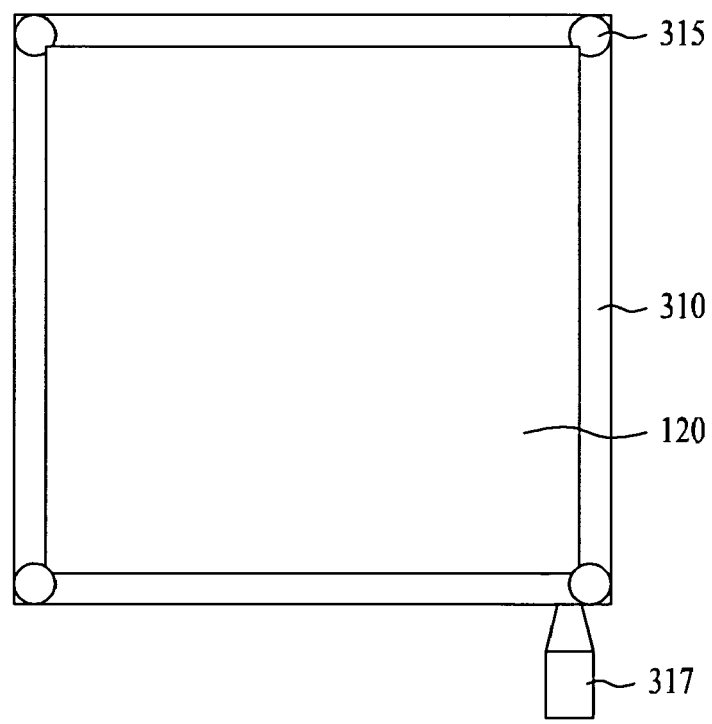
FIG. 9 shows a plane view of the mask state of FIG. 8.

FIG. 7 shows a schematic perspective view of a sequential lateral solidification (SLS) device according to the invention. FIG. 8 shows a cross sectional view of a mask stage and a substrate stage in an SLS device according to the invention. FIG. 9 shows a plane view of the mask stage of FIG. 8.

Referring to FIG. 7 to FIG. 9, the inventive SLS device 400 includes a laser beam generator (not shown) irradiating laser beams, a mask 120 having multiple areas, a mask stage 310, tilting mechanism 317 and leveling mechanism 315, and a substrate stage 330. At this time, the mask 120 having the multiple areas is loaded on the mask stage 310, wherein the mask 120 is moved by the mask stage 310 to transmit laser beams through a selective area of the mask 120. The tilting mechanism 317 and the leveling mechanism 315 minutely move the mask 120. Then, a substrate 200 is loaded to the substrate stage 330, so that it is possible to change a laser irradiation portion on the substrate 200 for the mask 120.

Furthermore, the SLS device 400 according to the invention includes at least one mirror ('300', for reference, 300a, 300b, 300c, 300d, and 300e of FIG. 8) for changing the laser beam path, a focusing lens (not shown) for focusing the laser beam before transmission to the mask 120, and a projection lens 320 for transmitting the laser beam to a corresponding pattern of the substrate 20 by reducing the laser beam transmitted to the mask 120.

Also, an optical mechanism is provided over the substrate stage 330, wherein the optical mechanism includes the focusing lens, the projection lens, the mirror 300, the mask 120, and the mask stage 310. Thus, the substrate 200 is loaded on the substrate stage 330, the laser beam irradiates as an adequate pattern onto the corresponding portion of the substrate 200, thereby advancing the crystallization process.

At this time, the mask 120 is defined as the multiple areas, and different patterns are defined in the respective areas. For example, the mask 120 divides into a first area of alignment key patterns for forming alignment keys 210a, 210b, 210c and 210d, and a second area for crystallization of a display part and a driving circuit part.

The mask stage 310 includes an additional tilting mechanism 317 and leveling mechanism 315. As a result, when the mask 120 is loaded on the mask stage 310 from an external position, the position of the mask 120 is adjusted with the tilting mechanism 317 and leveling mechanism 315. That is, when the mask 120 is not aligned straight in the center, the position of the mask 120 is adjusted by rotating the tilting mechanism 317. If the mask 120 deviates from the center to one side, the position of the mask 120 is adjusted by backward movement. If the mask 120 is not levelly loaded, the height of the mask 120 is adjusted with partial or whole utilization of the leveling mechanism 315 provided at the corner of the mask stage 310. In this case, it requires accuracy of 1 µm to 5 mm. Preferably, the accuracy is 1-100 µm.

After the mask 120 is loaded on the mask stage 310, the mask stage 310 is moved to correspond to the respective areas of the mask 120 used to laser irradiate areas of the substrate, thereby progressing alignment key formation and the crystallization process. That is, after completing the laser irradiation on one laser irradiation area of the substrate, the mask stage 310 is moved at a displacement corresponding to the size of one area, to juxtapose the area of the mask 120 with the next laser irradiation area of the substrate.

Figure 10:
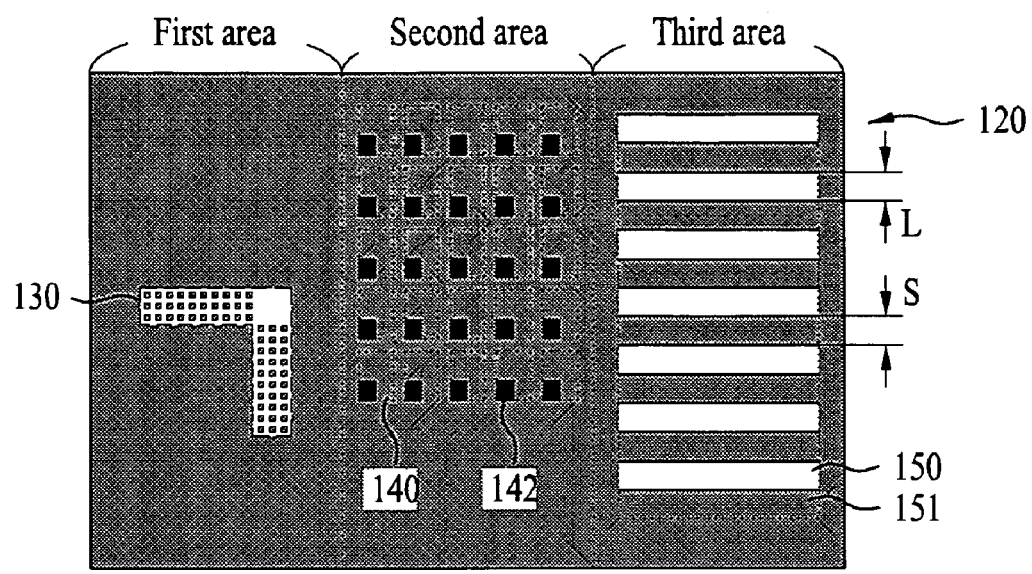
FIG. 10 shows a plane view of a mask used for an SLS method according to the invention.
Figure 11:
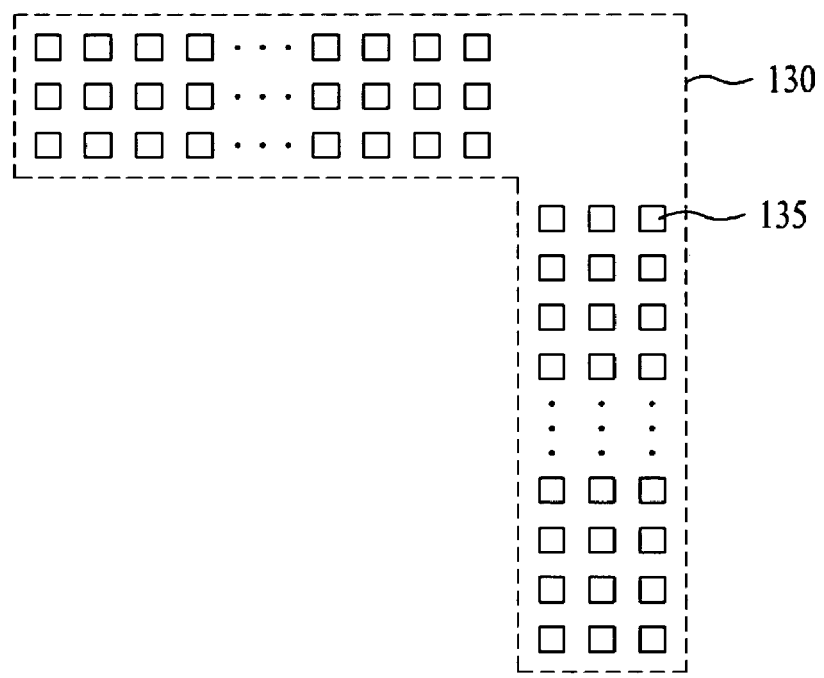
FIG. 11 shows an expanded view of a pattern formed in a first area of FIG. 10.
Figure 12:
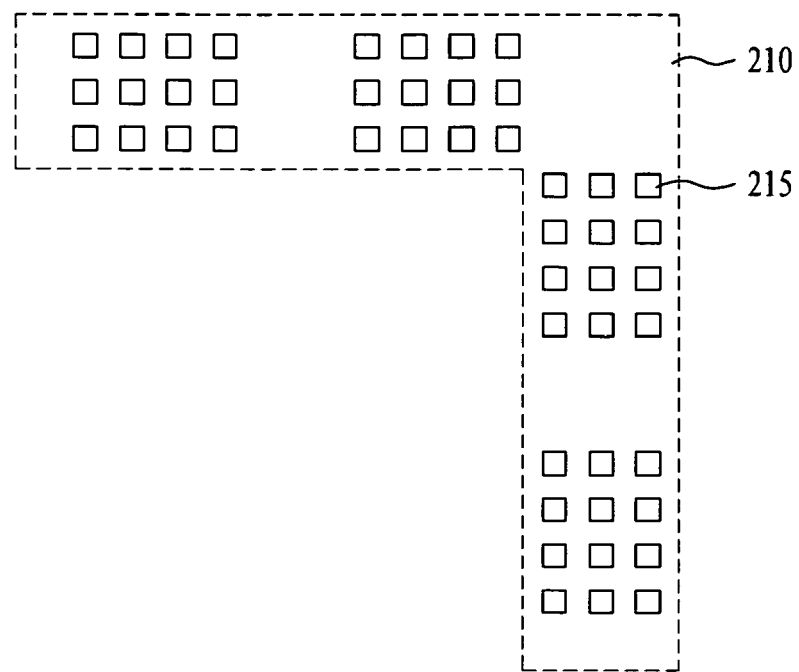
FIG. 12 shows an expanded view of an alignment key formed by an SLS method according to the invention.

FIG. 10 shows a plane view of a mask used for an SLS method according to the invention. FIG. 11 shows an expanded view of a pattern formed in a first area of FIG. 10. FIG. 12 shows an expanded view of an alignment key formed by an SLS method according to the invention.

FIG. 10 shows that the mask used for the inventive SLS method is divided into a first area for alignment key formation, a second area for crystallization of a semiconductor layer of a display part, and a third area for crystallization of a driving circuit part.

As shown in FIG. 11, a pattern 130 for alignment key formation of the first area is formed in a shape of '┐'. Alternately, the pattern 130 may be formed in a shape of 'ㄴ', 'ㄷ', 'ㄹ', 'ㅁ', 'ㅂ', 'ㅋ', 'ㅍ', '+', '◇', 'X', 'Y', 'O', '△', 'Θ', 'Φ', or 'θ'. The invention is not restricted to these patterns, and any appropriate pattern or combination of patterns can be used.

The pattern 130 for alignment key formation includes multiple minute patterns 135 provided at fixed intervals. The pattern 130 for alignment key formation of the first area allows the formation of alignment keys at the corners of the substrate by laser irradiation. In this case, the energy density of laser beam is determined at the intensity (or greater) of completely melting an amorphous silicon layer, and of removing the amorphous silicon layer irradiated with laser beam by ablation.

The alignment keys ('210' of FIG. 15) are formed by laser irradiation using the first area of the mask 120, where the alignment keys are formed at or near the four corners of the substrate 200. That is, the laser irradiation progresses when the substrate stage 300 is moved at all directions to correspond the pattern 130 for alignment key formation of the first area with the four corners of the substrate 200.

FIG. 7 shows the first to fourth alignment keys (210a, 210b, 210c, and 201d) are formed in a clockwise direction from the upper right corner of the substrate 200 to the upper left corner of the substrate 200 by using the pattern 130 for alignment key formation of the first area.

FIG. 12 shows that when the alignment keys 210 (210a, 210b, 210c, and 210d) are formed on the corners of the substrate 200, each of the alignment keys 210 is formed in a '┐'-shaped block configuration. Also, since the alignment keys 210 are formed to correspond with the minute patterns 135 of the mask 120, each of the alignment keys 210 is formed by removing the amorphous silicon layer according to multiple patterns 215 having a critical dimension (CD) of 1 μm. The invention is not restricted to a 1 μm critical dimension, and the invention can be used to a critical dimension down to about 0.1 μm or smaller.

Unlike conventional photolithography that removes or leaves a desired region using a photosensitive pattern (photoresist pattern), the alignment keys are patterned according to the following process: of depositing a buffer layer (not shown) and the amorphous silicon layer (not shown) over an entire surface of the substrate 200; of volatilizing a predetermined portion of the amorphous silicon layer by increasing the intensity of laser beam irradiation; of forming the multiple patterns 215 in intaglio; and of defining the alignment keys 210a, 210b, 210c, and 210d of '⌐' shape with the patterns 215.

The alignment key 210 corresponds to the shape of the pattern 130 for alignment key formation at the first area of the mask 120. At this time, the alignment key 210 is formed in a size to reduce the size of the pattern 130 for alignment key formation of the first area of the mask 120 by using a reduction ratio of the projection lens 320.

Figure 13:
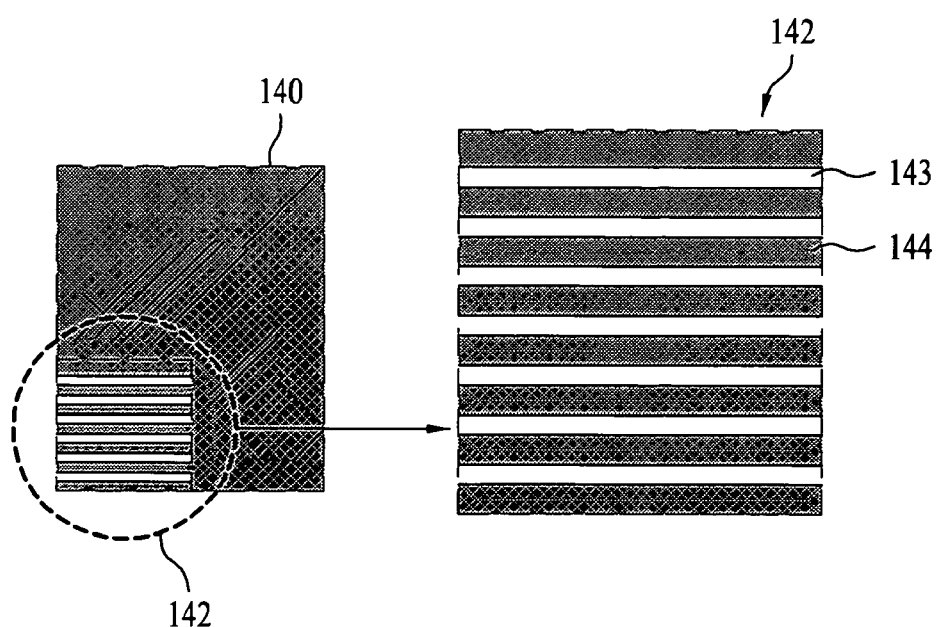
FIG. 13 shows an expanded view of one pattern formed in a second area of FIG. 10.

FIG. 13 shows an expanded view of one pattern formed in the second area of FIG. 10. FIG. 13 shows that the second area of the mask 120 includes one or more pattern blocks 142 (multiple pattern blocks are shown in the drawings, therefore, the explanation will be described on the basis of the state of having multiple patterns blocks) for the semiconductor layer of the display part. That is, multiple pixel regions 140 are formed corresponding to the display part of the substrate in the second area, and the multiple pattern blacks 142 are formed at respective portions corresponding to the semiconductor layer of the pixel regions.

Each of the pattern blocks 142 is formed of multiple transmission parts 143 and blocked (that is, light occluding) parts 144, wherein the transmission parts 143 and blocked parts 144 are positioned alternately.

Also, the size of the pattern block 142 is determined in due consideration of the reduction ratio (reduced by five times or four times) of the projection lens 320 and the portion for the semiconductor layer on the substrate 200. That is, the size of the pattern block 142 is determined with the value of multiplying the size of the portion for the semiconductor layer by the reduction ratio. The reduction ratio is not restricted in the invention. For example, a reduction ratio in the range of two to ten times can be used.

Substantially, the semiconductor layer formed over the substrate corresponds to a portion for a thin film transistor (device), wherein the channel has a size of 1-100 μm (preferably 10 μm) lengths and widths. Thus, the device is relatively smaller than a general mask for crystallization. In contrast, the related art tends to make the transmission part of the mask for crystallization have the width of 2-10 μm in irradiating area (In real mask design dimension, five times the irradiating area. Therefore, the real mask dimension is 10-50 μm), and to make the transmission part have the length of several μm (10-30 mm irradiating area. In real mask design dimension, five times the irradiating area. Therefore, the real mask dimension is 50-150 mm). On the other hand, in the invention, each transmission part of the pattern block 142 formed in the second area of the mask has a relatively short length of about 10 μm or even less.

Referring to FIG. 10, the third area of the mask 120 includes multiple transmission parts 150 and blocked parts 151, wherein the multiple transmission and block parts 150 and 151 are positioned alternately in the third area of the mask 120.

The width L of the transmission part 150 may be the same as the width S of the blocked part 151, or it may be smaller than the width S of the blocked part 151. If the transmission part 150 and the blocked part 151 have the same width (L=S), one unit area of the substrate corresponding to a pattern of the third area of the mask is crystallized using two shots (in this case, the substrate stage is moved to correspond a predetermined portion provided by the blocked part 151 during the first shot with the transmission part 150 during the second shot), in which it is referred to as a single scan. If the width L of the transmission part 150 is smaller than the width S of the blocked part 151, one unit area is crystallized using three or more shots, in which it is referred to as a multi scan.

Meanwhile, the width L of the transmission part 150 is not larger than the width S of the blocked part 151, since the mask 120 may be damaged when case the mask 120 overheats from the laser beam irradiation.

Hereinafter, an SLS method using the aforementioned SLS device and the mask having the multiple areas will be described with reference to the accompanying drawings.

Figure 14:
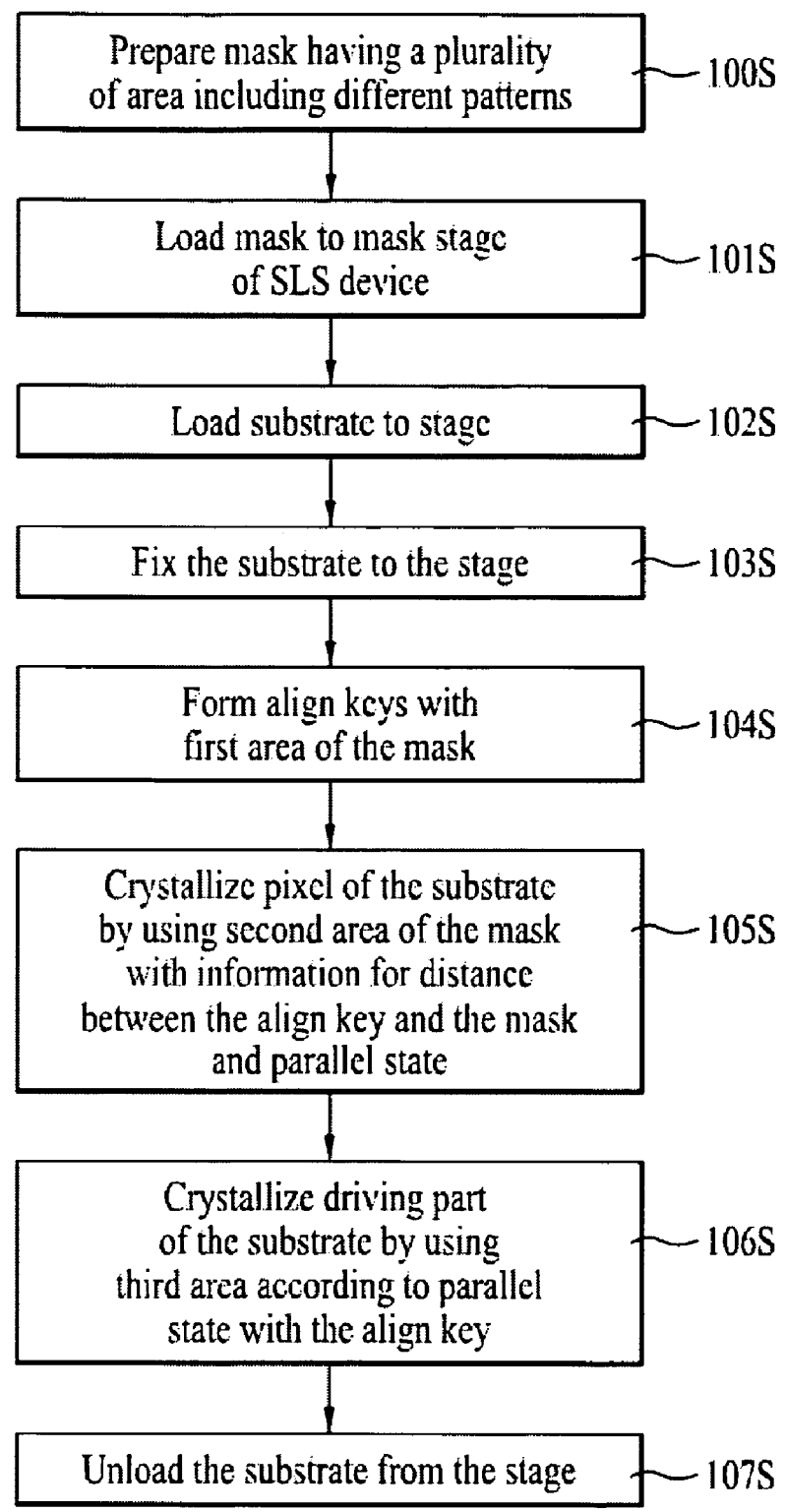
FIG. 14 shows a flow chart of an SLS method according to the invention.

FIG. 14 shows a flow chart of an SLS method according to the invention. Referring to FIG. 14, in the inventive SLS method, the mask 120 having the plurality of areas of the different patterns is prepared (S100) as shown in FIG. 10. For the purpose of explanation, assume that the mask 120 has the three areas. Subsequently, the mask 120 is loaded on the mask stage 310 of the SLS device (S101). Then, the substrate is loaded on the substrate stage 330 (S102). At this time, the substrate is defined as the display part of displaying image, and a non-display part around the display part. Also, the buffer layer and the amorphous silicon layer are deposited over the substrate in sequence. Then, the substrate is fixed to the substrate stage 300 by a fixing mechanism such as vacuum holes (S103).

Afterwards, the alignment keys are formed at the four corners of the substrate by using the first pattern (pattern for alignment key formation) of the first area on the mask (S104). At this time, the alignment keys are patterned by irradiating the laser beam at an energy density suitable for ablation of the amorphous silicon layer of the corresponding portion.

Subsequently, the crystallization direction is controlled to be in parallel with an imaginary line connecting the adjacent alignment keys by information of the distance from the alignment key on the substrate, thereby progressing the crystallization process to the portion for the semiconductor layer in each pixel region on the substrate (S105). By controlling the crystallization direction to be in parallel with the imaginary line connecting the adjacent alignment keys on the substrate, the crystallization process for the driving circuit part formed in the non-display part progresses (S106).

During the aforementioned steps S105 and S106, the laser beam irradiation using the first and second areas of the mask proceeds at the energy density sufficient to completely melt the amorphous silicon layer of the corresponding portion.

When performing the laser beam irradiation using the first and second areas of the mask, since the devices are provided along one line, it is necessary to obtain the same number of grain boundaries overlapped in each channel of the devices provided along one line. When controlling the number of grain boundaries overlapped in each channel of the devices, the crystallization process is performed parallel to the imaginary line connecting the adjacent alignment keys on the substrate. The laser beam irradiation using the first and second areas of the mask is performed while controlling the crystallization direction in a parallel direction with the imaginary line of connecting the adjacent alignment keys.

Subsequently, the substrate is unloaded from the substrate stage (S107), and the unloaded substrate stands ready for the next process. During the laser beam irradiation process using one area of the mask, like alignment key formation (S104) and crystallization (S105 and S106) process, the remaining areas are blocked, i.e., light is not irradiated onto the remaining areas.

The mask of FIG. 10 is divided into three areas. However, it is also possible to use a mask divided into two areas of an alignment key area and a crystallization area. In this case, the crystallization method of using the mask having the two areas uses the same process as the crystallization method of using the mask of FIG. 10 except that the display part and the non-display area of the substrate are crystallized using the crystallization area of the mask.

Figure 15:
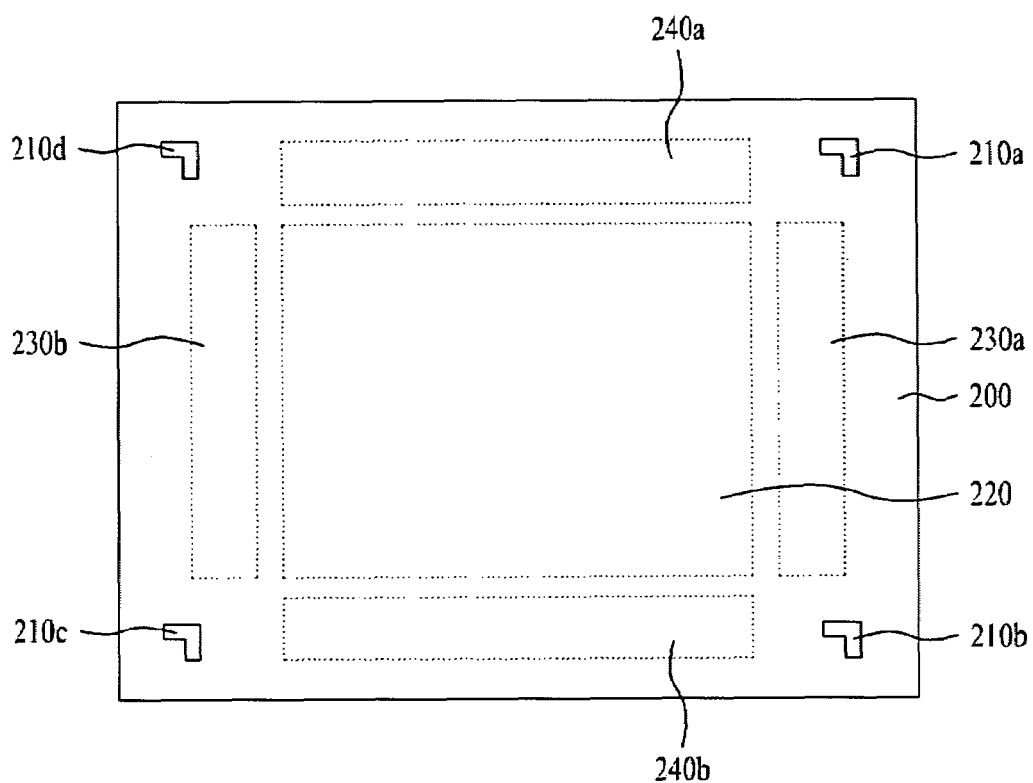
FIG. 15 shows a plane view of respective crystallized areas formed on a substrate by an SLS method according to the invention.

FIG. 15 shows a plane view of respective crystallized areas formed on the substrate by the SLS method according to the invention. Referring to FIG. 15, in the laser irradiation process using the SLS method according to the invention, the laser irradiation area is divided into three sub-areas, that is, i) the alignment keys 210a, 210b, 210c, and 210d, ii) the display part 220, and iii) the driving circuit part of gate drivers 230a and 230b and source drivers 240a and 240b.

The gate drivers 230a and 230b and source drivers 240a and 240b are formed to have a dual structure at left and right sides or upper and lower sides of the display part 220. Generally, over the substrate having a thin film transistor array, the driving circuit part may have one gate driver at one side perpendicular to a gate line, and one source driver at one side perpendicular to a data line. This configuration gives due consideration to the rapid operation of the driving circuit parts.

After forming the alignment keys 210a, 210b, 210c, and 210d, the crystallization process is progresses in order of the display part 220 and the driving circuit part 230a, 230b, 240a, an 240b. Alternately, after performing the crystallization for the driving circuit part 230a, 230b, 240a, and 240b, the crystallization for the display part 220 may be performed.

As described above, the crystallization process may selectively progress to the portion of the semiconductor layer in the display part 220. Alternately, the crystallization process may progress to the entire surface of the display part 220 as follows.

The driving circuit part has the gate drivers 230a and 230b form in a vertical direction, and the source drivers 240a and 240 form in a horizontal direction. The crystallization process may be started from any one of the gate and source drivers.

At this time, after accomplishing the crystallization of the driver provided at one side of the substrate 200 by irradiating laser with the third area of the mask 120, the mask stage 310 or the substrate stage 330 is rotated by about 90°, whereby a grain boundary having the same direction forms in each of the devices provided along one line and formed in the drivers.

Meanwhile, the crystallization method using the three areas of the mask 120, as shown in FIG. 15, may be used for the substrate having the gate driver and the source driver defined along one direction, as well as the substrate having the gate driver and the source driver defined along both directions in the non-display part.

Another SLS method according to another embodiment of the invention will be described as follows.

Instead of selectively crystallizing a portion of a semiconductor layer in a display part, an entire surface of the display part and a driving circuit part crystallizes using the same mask.

In the SLS method according to another embodiment of the invention shown in FIG. 15, a substrate having a display part 220 and a non-display part (remaining portions except the display part) around the display part is prepared. Then, a buffer layer (not shown) is formed over an entire surface of the substrate 200, and an amorphous silicon layer (not shown) is formed over an entire surface of the buffer layer.

Subsequently, a mask (not shown, having a first area and a third area as in FIG. 10) having alignment key area and crystallization area corresponds to the substrate 200. Then, a laser beam is irradiated on predetermined portions of the non-display part through the alignment key area of the mask, thereby forming alignment keys. The alignment keys are formed at or near four corners of the non-display part. At this time, the laser beam is irradiated at an energy density suitable for ablation of the corresponding portion of the amorphous silicon layer using the alignment key area of the mask.

After that, the crystallization process progresses by irradiating a laser beam onto the display part and the driving circuit part of the non-display part through the crystallization area of the mask. The laser beam irradiation using the crystallization area of the mask uses a laser beam having an energy density sufficient to completely melt the amorphous silicon layer of the corresponding portion.

On performing the laser beam irradiation using the first and second areas of the mask, when the devices are provided along one line, it becomes necessary to obtain the same number of grain boundaries overlapping in each channel of the devices provided along the one line. When controlling the number of grain boundaries overlapping in each channel of the devices, the crystallization process is performed in parallel to an imaginary line of connecting the adjacent alignment keys on the substrate. For the laser beam irradiation process using one area of the mask, the remaining areas of the mask are blocked, i.e., not irradiated.

Figure 16A:
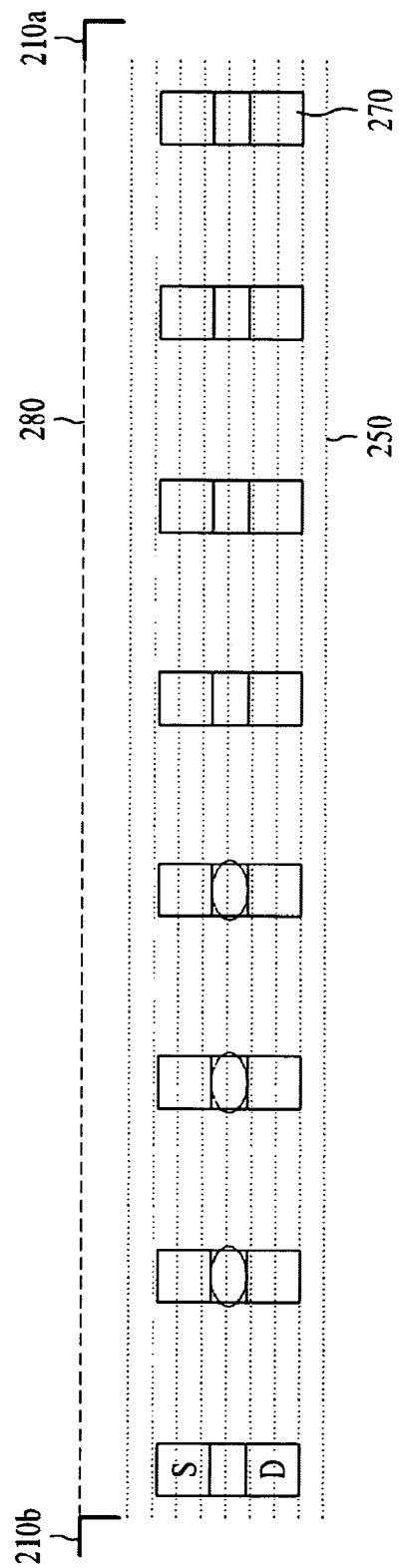
FIG. 16A and FIG. 16B illustrate devices provided along one line by an SLS method according to the invention.
Figure 16B:
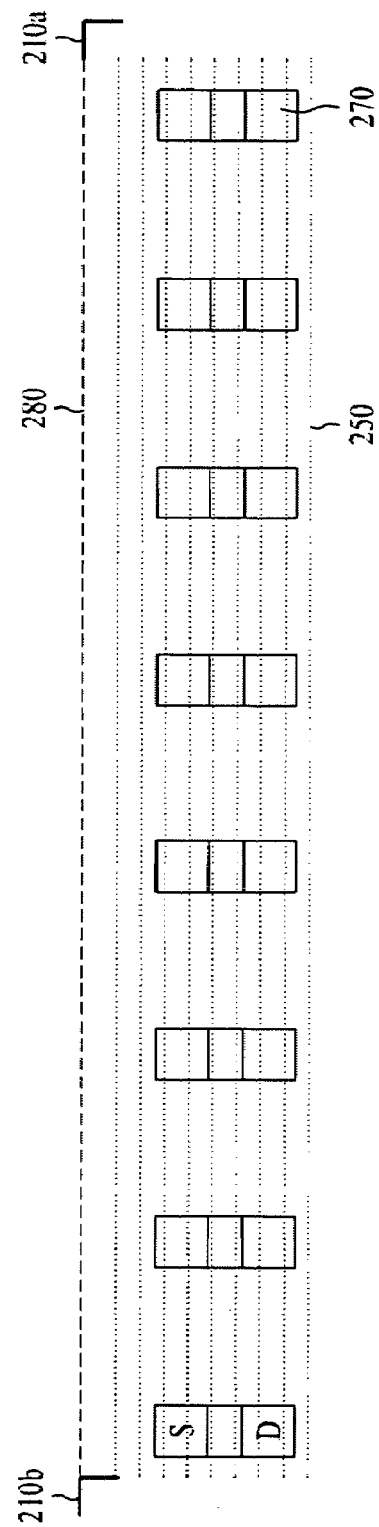

FIG. 16A and FIG. 16B illustrate the devices provided along one line by using the SLS method according to the present invention.

As shown in FIG. 16A and FIG. 16B, the crystallization process progresses in parallel to the imaginary line 280 connecting the adjacent alignment keys 210a and 210b. In the drawings, the imaginary line 280 between the adjacent first and second alignment keys 210a and 210b runs parallel to the crystallization direction. At this time, a grain boundary forms along the crystallization direction. As a result, the crystallization process progresses in parallel to the imaginary line 280 of the adjacent first and second alignment keys 210a and 210b, and the crystallization direction thus corresponds to the grain boundary direction.

The semiconductor layer (i.e., the device of the display part, and the driving circuit part) is patterned by photolithographic process (using a positive or negative photoresist) after crystallization using the first to fourth alignment keys 210a, 210b, 210c, and 210d, where the devices 280 provided along the same line are perpendicular to the grain boundary direction. The number of the grain boundaries overlapping in each channel of the devices 270 may be one as shown in FIG. 16A, or may be two as shown in FIG. 16B. However, the invention can be practiced using any appropriate number of grain boundary overlaps.

Ablation of the amorphous silicon layer forms the alignment key 210 before crystallization using the pattern for alignment key formation, formed in the first area of the mask 120. Here, the alignment key serves as the index for a distance from the laser irradiation area of the substrate 200, thereby controlling the laser irradiation area (crystallization area). Also, the imaginary line of the adjacent alignment keys corresponds to the grain boundary direction, so that it is possible to realize the same number of grain boundaries overlapping in each channel of the devices, thereby obtaining the uniform characteristics in the respective devices.

As discussed above, the SLS device and the SLS method using the same have the following advantages.

First, a number of different patterns are formed in one mask, so that it is possible to decrease the fabrication cost of the additional mask for alignment key formation before the crystallization process.

By adding the tilting mechanism and the leveling mechanism to the mask stage, the mask is moved along the X-Y-Z-axis, so that it is possible to adjust the position of the mask if the mask is not straight in the center (i.e., off center), deviates from the center to one side, or is not levelly loaded.

Furthermore, the invention achieves the possibility to progress the crystallization process on the substrate for formation of the grain boundary in parallel with the imaginary line of the adjacent alignment keys, thereby obtaining uniform characteristics in the respective devices.

By forming the alignment keys before the crystallization process, the alignment keys are used as an index for the distance from the mask, and for determining parallel alignment with the grain boundary. Also, the alignment keys may be used for the required photolithographic patterning process(es) after the crystallization, thereby simplifying the fabrication process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A sequential lateral solidification (SLS) device comprising:
    a laser beam generator;
    a mask having an alignment key area and a crystallization area;
    a mask stage, the mask being mounted over the mask stage, the mask stage being moved to transmit the laser beam through a selected area of the mask; and
    a substrate stage for moving a substrate, to change portions of the substrate irradiated with the laser beam passing through the mask,
    wherein the substrate has a display part including a plurality of pixels and a non-display part including a driving circuit,
    wherein the crystallization area of the mask is divided into a first area and a second area, the first area corresponding to the display part of the substrate, the second area corresponding to the non-display part of the substrate, and
    wherein the first area includes at least one pattern block having a plurality of transmission parts and non-transmission parts, the pattern block having a size corresponding to a semiconductor layer of one pixel in the substrate.

2. The SLS device of claim 1, wherein the alignment key area includes a plurality of transmission patterns.

3. The SLS device of claim 2, wherein the plurality of transmission patterns are formed at fixed intervals.

4. The SLS device of claim 1, wherein a plurality of said pattern blocks are formed at fixed intervals.

5. The SLS device of claim 1, wherein the second area has a plurality of transmission parts and non-transmission parts.

6. The SLS device of claim 1, wherein the mask stage is moved to the right and left directions on the same plane, to correspond with the selected area of the mask.

7. The SLS device of claim 1, further comprising tilting mechanism and leveling mechanism to adjust a fine movement of the mask.

8. The SLS device of claim 7, wherein the tilting mechanism moves the mask stage horizontally by rotation.

9. The SLS device of claim 7, wherein the leveling mechanism moves the mask stage vertically.

10. A sequential lateral solidification (SLS) mask, which comprises:
    an align key area; and
    a crystallization area,
    wherein the crystallization area of the mask is divided into a first area and a second area, the first area corresponding to a display part of a substrate, the second area corresponding to a non-display part of the substrate, and
    wherein the first area includes at least one pattern block having a plurality of transmission parts and non-transmission parts, and the pattern block has a size corresponding to a semiconductor layer of one pixel in the substrate.

11. The mask of claim 10, wherein the align key are includes a plurality of transmission patterns.

12. The mask of claim 11, wherein the transmission patterns are formed at fixed intervals.

13. The mask of claim 10, wherein a plurality of said pattern blocks are formed at fixed intervals.

14. The mask of claim 10, wherein the second area has a plurality of transmission part and non-transmission parts.

* * * * *